United States Patent [19]
Wong

[11] Patent Number: 5,841,694
[45] Date of Patent: Nov. 24, 1998

[54] HIGH PERFORMANCE PROGRAMMABLE INTERCONNECT

[75] Inventor: Ting-wah Wong, Cupertino, Calif.

[73] Assignee: Programmable Silicon Solutions, Sunnyvale, Calif.

[21] Appl. No.: 903,547

[22] Filed: Jul. 30, 1997

[51] Int. Cl.$^6$ .................................................. G11C 7/00
[52] U.S. Cl. .............................. 365/185.05; 365/185.18; 365/185.21
[58] Field of Search .................. 365/185.07, 185.18, 365/185.2, 185.24, 185.21, 189.05

[56] References Cited

U.S. PATENT DOCUMENTS

| | | | |
|---|---|---|---|
| 3,764,396 | 10/1973 | Tarui et al. | 365/189.07 |
| 4,943,943 | 7/1990 | Hayashi et al. | 365/189.09 |
| 5,018,104 | 5/1991 | Urai | 365/200 |
| 5,251,169 | 10/1993 | Josephson | 365/72 |
| 5,457,653 | 10/1995 | Lipp | 365/185.18 |
| 5,524,097 | 6/1996 | Lee | 365/185.21 |
| 5,541,529 | 7/1996 | Mashiko et al. | 326/29 |
| 5,561,629 | 10/1996 | Curd | 365/185.21 |
| 5,617,354 | 4/1997 | Cha et al. | 365/185.21 |
| 5,638,326 | 6/1997 | Hollmer et al. | 365/185.18 |

OTHER PUBLICATIONS

Peng, J.Z., et al., Impact of Tunnel Oxide Quality on Vt Disturb and Sort Yield of High Density Flash Memory FPGA Devices, Abstract for 1997 NVSMW (1997), p. 1–2.

*Primary Examiner*—Son T. Dinh
*Attorney, Agent, or Firm*—Trop,Pruner,Hu&Miles,P.C.

[57] ABSTRACT

A high performance programmable interconnect enables scaled transistors to be utilized, in conjunction with memory cells, as transfer gates with improved speed characteristics. Boosted positive and negative drive voltages are supplied to the transfer gate depending on the programmed state of the memory cell. The transfer gate may be driven by an inverter using a transistor formed in a triple well.

28 Claims, 2 Drawing Sheets

HIGH PERFORMANCE PROGRAMMABLE INTERCONNECT

FIELD OF THE INVENTION

This invention relates generally to memory devices and particularly to an interconnect or transfer gate controlled by a memory device.

BACKGROUND OF THE INVENTION

As integrated circuits scale to smaller and smaller geometries and supply voltages continue to decrease, a number of technologies which rely on voltage differences have become increasingly more difficult to implement in an effective fashion. The use of smaller voltages means that the speed at which devices operate may be diminished.

For example, pass transistors, sometimes also called transfer gates, interconnect basic building blocks of various components of integrated circuits. Programmable interconnects use a memory cell to control conduction of a pass transistor. Among the myriad of applications for programmable interconnects are implementing a capacitive load adjustment capability such as that necessary with crystal oscillator circuits for frequency adjustment, implementing resistance adjustments such as those necessary for DC to DC converters, and implementing programmable logic devices.

The ideal transfer gate can switch between the "on" and "off" states without excessive power consumption. It primarily operates in the linear region to achieve low resistance. In addition, the parasitic capacitance associated with the transfer gate should be lower than that of the input or output capacitance of the circuits which it connects.

As integrated circuits have scaled to smaller and smaller geometries, designers have been effective in reducing the power supply voltages which such devices utilize. While it is very advantageous to decrease the necessary power supply voltage, a number of problems arise with respect to the "on" resistance when the supply voltage decreases. See L. A. Glasser and D. W. Dobberpuhl, *The Design and Analysis of VLSI Circuits*, (December 1985) published by Addison-Wesley Publishing Co. at page 108. The transistor linear region resistance is inversely proportional to the gate to source voltage or "$V_{GS}$" less the threshold voltage or "$V_T$".

As the supply voltage is scaled to ever lower voltages, this voltage difference can be reduced significantly. In addition, the transistor saturation voltage scales as $(V_{GS}-V_T)$ decreases. As the device geometry scales, transistors may also run into what is known as "velocity saturation". Thus, the voltage range where the transistor operates in the linear region becomes increasing narrow as geometries and supply voltages are scaled.

Conventionally, to reduce the "on" resistance of a transfer gate, a designer may consider one of a number of known approaches. The designer may increase the transistor width to thereby decrease the "on" resistance. There is a linear relationship between increasing transistor width and decreasing "on" resistance. However, the source/drain parasitic capacitance also increases linearly with increasing transistor width. Thus, the reduction of "on" resistance in this fashion may result in an unacceptable increase in parasitic capacitance. Particularly, since the resistance times the capacitance or "RC product" typically stays constant for a given technology, the increased width of the transfer gate does not significantly improve the performance of the transistor.

Another approach is to increase the transfer gate drive by using a floating gate transistor. See U.S. Pat. No. 5,457,653.

However, the usefulness of this approach is limited by the data retention requirement. That is, the floating gate voltage cannot exceed 4 to 5 megavolts per centimeter because the floating gate must retain its data for ten years and also for disturb concerns. This approach, therefore, implemented as an EEPROM, pays for increased gate drive with an increased potential for reliability problems and particularly the possibility of gate oxide breakdown and read disturb.

Because the transistor linear region resistance scales inversely with gate voltage less the threshold voltage, and the saturation voltage scales with gate voltage less the threshold voltage, if the gate voltage is equal to the supply voltage, the linear region "on" resistance increases and the voltage range where the transistor operates in the linear region narrows. Surprisingly, this problem becomes more severe with the latest, scaled technologies. That is, as devices scale in terms of geometry and supply voltages, the problem is exacerbated for pass transistors. This means that, contrary to the well established industry conventional wisdom, at a certain point, continuing to scale devices and supply voltages may be counterproductive to improved pass transistor operating speed. Reducing supply voltage and scaling geometries, which have previously resulted in lower power consumption, could actually result in slower logic and pass transistors as supply voltages drop below 3 volts.

Thus, a solution to this trade off, which is more desirable than any currently envisioned, is needed to enable the continued increase in programmable interconnect speed with scaled technologies.

SUMMARY OF THE INVENTION

In accordance with one aspect of the present invention, a programmable interconnect includes a memory cell capable of having a programmed state. The interconnect includes a first transistor having a gate electrode and a control circuit communicating either a positive or negative potential to the gate electrode of the first transistor depending on the programmed state of the memory cell.

In accordance with another aspect of the invention, a programmable interconnect includes an approximately zero threshold transistor having a gate electrode. A memory cell is capable of having a programmed state. The memory cell is adapted to communicate with the transistor such that the programmed state of the cell determines whether the transistor conducts. The transistor's gate electrode is selectively connectable to a negative potential.

In accordance with yet another aspect of the invention, a method of controlling a transfer gate includes the steps of applying a control signal to the gate electrode of a memory cell. A negative potential is applied to the source of the memory cell. The conducting state of the cell is sensed, and based on the conducting state of the cell, either a positive or negative potential is applied to the transfer gate.

DESCRIPTION OF THE PREFERRED EMBODIMENTS

Figure 1:
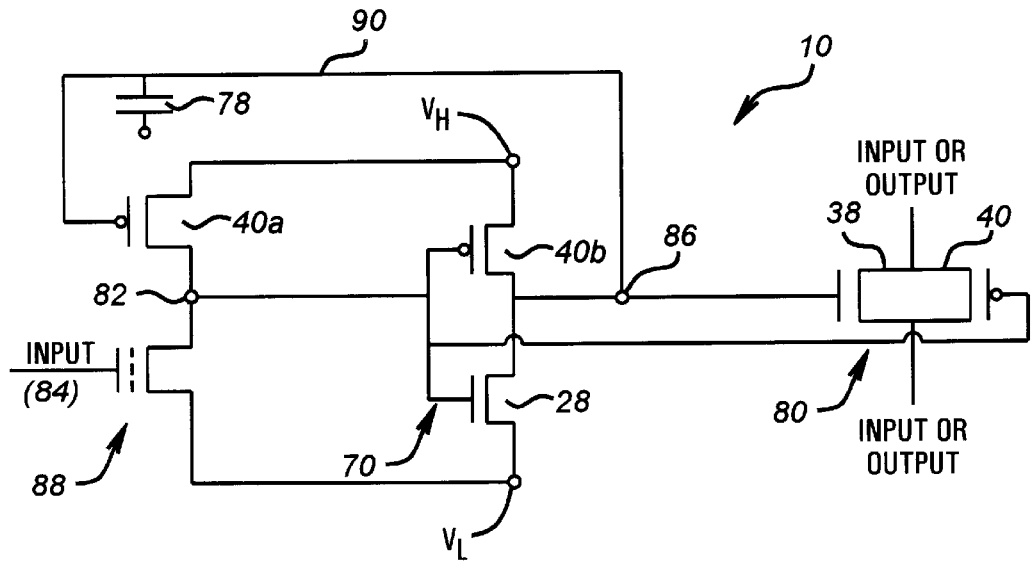
FIG. 1 is a circuit diagram of one illustrative CMOS programmable interconnect.

A programmable interconnect 10, shown in FIG. 1, includes a transfer gate 80, an inverter 70 and a non-volatile memory cell 88. The memory cell could be an EPROM, an EEPROM or a flash memory cell.

In response to an input 84, the cell 88 either conducts or does not conduct depending on the programmed state of the cell 88. The cell 88 is "off" if its floating gate is programmed with electrons and it is "on" if its floating gate is not programmed. The input 84 may be set at Vcc, Vss or any level in between.

The inverter 70 spans between the positive potential $V_H$ and the negative potential $V_L$. A loop 90 feeds the output of the inverter 70 back to the transistor 40a. When the input 84 is applied to the cell 88, and the cell 88 is unprogrammed or has no charge or positive charge on the floating gate, the node 82 goes to $V_L$. As the node 82 goes low, the inverter 70 produces a higher signal at the node 86 which turns the transistor 40a off progressively harder.

Thus, the node 82 goes to $V_L$ and no conduction is provided in the path between the transistor 40a and the cell 88. The loop 90 includes a capacitor 78 for smoothing transients and to hold the node 86 at a low voltage for a short time (perhaps a few microseconds) during power up. The level $V_L$ at node 82 is converted to a level $V_H$ at node 86 which turns "on" the transfer gate 80.

The illustrated transfer device 80 is a CMOS device which includes an NMOS thicker gate oxide transistor 38 and a PMOS thicker gate oxide transistor 40. The gate of the transistor 40 is driven by the node 82 side of the inverter 70 and the gate of the transistor 38 is driven by the node 86 side of the inverter 70.

While the transfer gate 80 is illustrated as a CMOS transfer gate, it should be understood that the transfer gate 80 could also be implemented by a single transistor 38 in an NMOS implementation. Similarly, while an inverter 70 is illustrated as the buffer or control circuit for converting the cell 88 state into a control signal for the transfer gate 80, other circuit implementations, such as a latch, could also be used.

When the cell 88 is programmed with electrons on the floating gate and does not conduct, the node 82 goes to $V_H$. When the node 82 is at $V_H$ the node 86 is at $V_L$ and the transistors 38 and 40 are turned off. Since the node 86 is at $V_L$, the transistor 40a is turned on. This causes the node 82 to rise to the level $V_H$. Since the cell 88 is off, there is no conduction in the path from the node 40a through the cell 88. Thus, whatever the programmed state of the cell 88, there is never any power consumption between $V_H$ and $V_L$ because there is no current flow between $V_H$ and $V_L$.

Figure 3:
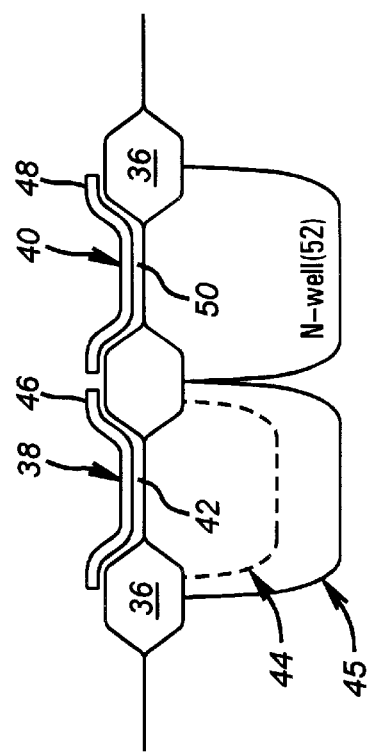
FIG. 3 is a partial, enlarged cross-sectional view of three additional transistor configurations used in FIG. 1.

The transistors 40, 40a and 40b may all be p-channel thicker gate oxide transistors formed in accordance with the configuration shown for the transistor 40 in FIG. 3. The transistor 38 may be a thick gate oxide n-channel transistor formed as shown in FIG. 3. The transistor 38 may be an approximately zero threshold transistor. It may also be desirable to form the transistor 38 in a triple well or embedded p-well in some situations.

Figure 2:
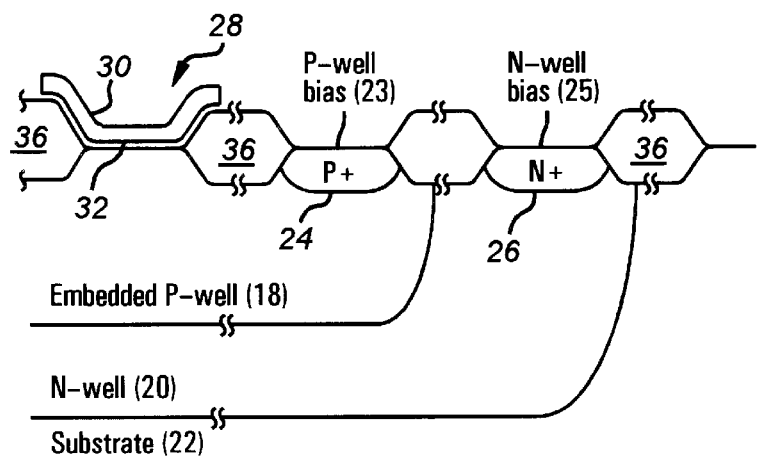
FIG. 2 is a partial, enlarged cross-sectional view showing the configuration for transistors used in FIG. 1.

Finally, the transistor 28 is configured, as shown in FIG. 2, in a triple well. In this way, the source of the transistor 28 can be driven negatively causing the transistor 28 to turn off very hard. This improves the efficiency of both the inverter 70 and the overall programmable interconnect 10.

Figure 1A:
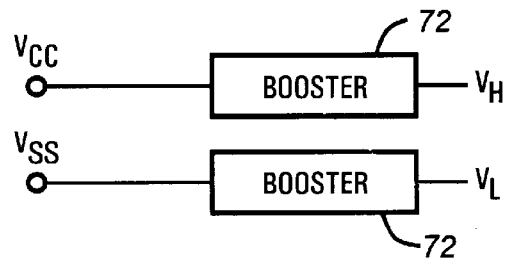
FIG. 1a is a block diagram showing the voltage boosters.

The circuit 10 may receive two external supply voltages Vcc and Vss is shown in FIG. 1a. The supply voltage Vcc may be 5 volts or less and the voltage Vss may be 0 volts. The supply voltages Vcc and Vss are boosted by boosters 72 to form the boosted voltages $V_H$ and $V_L$. The boosted voltages $V_H$ and $V_L$ may be several times more positive than the Vcc and more negative than the Vss voltage. For example, $V_H$ could be in the range of 4 to 12 volts while $V_L$ could be in the range of −2 to −5 volts. Alternatively, the circuit 10 may receive all of Vcc, Vss, $V_H$ and $V_L$ from external voltage supplies.

The transistor 28 may be formed in an embedded P-well 18, as shown in FIG. 2. The embedded P-well 18 is formed in an N-well 20 which is, in turn, defined within a P-type semiconductor substrate 22. P-well bias 23 can be applied through a P+ region 24, and N-well bias 25 may be applied through an N+ region 26. The transistor 28 includes a gate electrode 30 and a gate oxide 32 with an active region defined by field oxide areas 36.

CMOS N- and P-channel transistors 38 and 40 may be formed, as shown in FIG. 3. The thicker gate oxide N-channel transistor 38 may include a thicker gate oxide 42 and a gate electrode 46. Similarly, the thicker gate oxide P-channel transistor 40 includes a gate electrode 48 formed over a thick gate oxide 50, in turn defined over an N-well 52.

The transistor 38 may be formed without a p-well or with a light p-well 44 or a light p-well 44 embedded in n-well 45 so that it is an approximately zero threshold transistor. By "zero threshold" it is intended to refer to transistors with relatively light p-wells, for example, having concentrations of less than $1\times10^{16}$ atoms per cubic centimeter, or no p-well at all. Thus, the zero threshold transistor may have a small threshold voltage of from about 0.1 to −0.3 volts.

Figure 5:
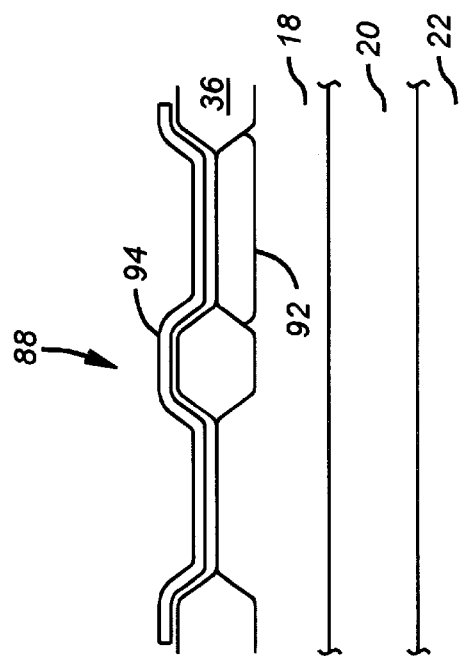
FIG. 5 is a view corresponding to FIG. 4 of another embodiment.
Figure 4:
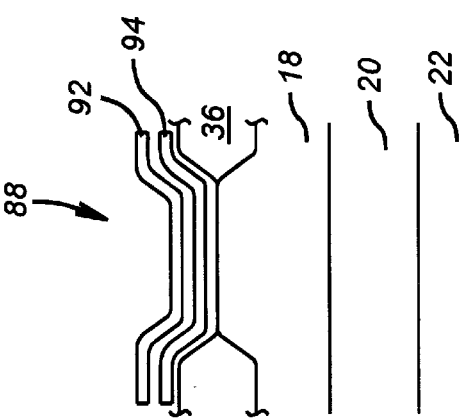
FIG. 4 is a partial, enlarged cross-sectional view of the memory cell used in FIG. 1.

The memory cell 88 may be formed in the same triple well with the transistor 28, as shown in FIG. 4. In this way, the cell 88 may have a negative voltage ($V_L$) applied to its source. The memory cell 88 includes a control gate 92 and a floating gate 94. The control gate can be either a polysilicon layer as shown in FIG. 4 or an N+ diffusion layer as shown in FIG. 5

The boosted voltages $V_H$ or $V_L$ may be formed by boosting positive (Vcc) and negative (Vss) supply voltages using conventional charge boosting circuitry (not shown). These boosted gate drive voltages increase the difference ($V_{GS}-V_T$), thereby decreasing the "on" resistance and increasing the saturation voltage of the transfer gate implemented by the transistor 38.

The transfer gate 80 "on" resistance for the linear region can typically be reduced by a factor of 2 to 4 depending on the gate bias. At the same time, the use of thicker gate oxides for the transistors 38, 40 of the transfer gate 80 allows higher gate voltages to be applied to each transistor without creating reliability problems.

Thus, the term $V_{GS}-V_T$ may be increased without causing gate oxide reliability problems. Typically, in 0.6 micron or less technologies, using 3 volts or less, the gate oxides 32, 42, and 50 may be 120 Angstroms thickness or greater while conventional gate oxides may be less than 100 Angstroms.

By providing an embedded P-well transistor 28 and memory cell 88, the N-well 20 may be tied to Vss or Vcc. This allows the P-well 18 to be pumped negatively. This in turn allows the sources of the transistor 28 and memory cell 88, situated in the P-well 18, to go negative. Therefore, a negative voltage, such as $V_L$, may be applied to the source of the transistor 28 or memory cell 88 in the configuration shown in FIG. 1. This enables the transistor 28 and pass transmitter 38 to shut off very hard.

The negative gate drive on the transistor 38, 40 also reduces the gate-to-N junction overlap capacitance and the junction capacitance. Because of the negative gate voltage, the channel and well doping concentrations can be reduced. Hence, one transistor 38 is situated in a "light" p-well 44. Typically, the p-well doping concentration may be reduced or eliminated. For example, well doping may be reduced from a typical concentration of $1\times10^{17}$ to $1\times10^{16}$ atoms per cubic centimeter or less. This may achieve a substantial reduction in the junction capacitance of the transistor. The negative voltage also reduces the N-depletion capacitance in the N-region under the gate oxide typically by a factor of 2 to 3. Furthermore, by embedding the transistor or transistors of the transfer gate 80 in a p-well, when the n-well is tied to Vss or Vcc, negative voltage can be applied to the p-well and the junction depletion region increases. This reduces the junction capacitance even further, for example, by a factor of 1.5.

The charge pump for creating the high and low voltages $V_H$ and $V_L$ can be implemented using standard charge pump designs. The reference "On Chip High Voltage Generation and MOS Integrated Circuits Using an Improved Voltage Multiplier Technique", *IEEE Journal of Solid State Circuits*, Vol. SC-11, No. 3, June 1976, discloses one useful design for creating the high voltage charge pump and is hereby expressly incorporated herein. Similarly, the provision of both a positive or negative boosted voltage can be accomplished as taught in L. A. Glasser and D. W. Dobberpuhl, *The Design and Analysis of VLSI Circuits* (December 1985) published by Addison-Wesley Publishing Co., pages 301–329, which is hereby expressly incorporated by reference herein.

Ideally, the boosted voltage $V_H$ is set to the highest possible voltage before any long term gate oxide reliability problems occur. This reduces the "on" state resistance of the transfer gate. The voltage $V_L$ is set at a low negative voltage such that the N-junction region capacitance can be reduced. Typically, $V_L$ is −1.5 to −2.0 v.

The thickness of the thicker gate oxides for the transistors 28, 38 and 40 can be determined by first determining the maximum voltage level that needs to be transferred by the transfer gate 38. Normally this transfer voltage is equal to Vcc. The transistor saturation voltage, "$V_{DSAT}$", is set such that $V_{DSAT}$ is greater than or approximately equal to the transfer voltage. Thus, the transistor always operates in the linear region. Using the following equation, the term "$V_{GS}-V_T$" can be determined:

$$V_{DSAT} = A + B - \sqrt{A^2 + B^2}$$

Where: $A=(V_{GS}-V_T)/(1+\delta)$;
$B=V_{MAX}L/\mu$
$V_T$=the transistor threshold voltage;
L=channel length
$\mu$=mobility; and
$V_{MAX}$=maximum carrier velocity (~$10^7$ cm./s).

$$\delta = \frac{\gamma}{2\sqrt{V_{SB} + 2\phi_{FP}}}$$

$$\gamma = \frac{\sqrt{2\epsilon_{si} q Na}}{Cox}$$

Where: VsB=source to bulk potential
$\Phi_{FP}$=potential at inversion surface
$\epsilon_{si}$=silicon dielectric constant
Na=bulk doping concentration
Cox=oxide thickness
q=electron charge The oxide thickness Cox is generally greater than or approximately equal to ($V_{GS}-V_T$) divided by the electric field (E) or about 4 to about 5 megavolts per centimeter. Thus, for a 3-volt transfer voltage, $V_{GS}-V_T$ is approximately 6 to 8 volts and Cox would be about 150 to 200 Angstroms with a channel length of from about 0.6 to 0.8 microns.

A few examples may help to appreciate the impact of the present invention. Using a thicker gate oxide thickness of 150 Angstroms and a channel length of 0.6 microns, the quantity $V_{GS}-V_T$ is approximately 6 volts. The transistor current at a $V_{DSAT}$ of 3 volts results in a drain current of about 750 microamps per micron at 3 volts. The drain current is about 633 microamps per micron at 2 volts.

This can be contrasted with a conventional technology which would have a gate oxide thickness of about 100 Angstroms and a gate length of about half a micron using 3-volt technology. The transistor current at a $V_{DSAT}$ equal to 3 volts is approximately 330 microamps per micron. It is evident that the thick gate oxide enables a significantly greater drive current.

Similarly, with a 2-volt technology using a gate oxide thickness of 70 Angstroms and a gate length of 0.35 microns, the drain current would be approximately 250 microamps per micron. Thus, it is evident that decreasing gate lengths and decreasing gate voltages have a dramatically adverse effect on drain current. This necessarily has a severe impact on speed.

Thus, it can be seen that at supply voltages of 3 volts and less, device scaling can result in slower devices. The present invention allows for significantly increased transistor speeds at significantly scaled geometries and with significantly scaled supply voltages.

The illustrative parameters set forth herein contemplate a 0.35 $\mu$m or higher feature size with Vcc potentials of 2.7 volts or higher. As the technology permits lowering voltages and smaller feature sizes, the parameters herein would scale accordingly.

The starting substrate material is typically P-type (100) silicon, for example having a resistivity range of 10–25 ohm-cm. The P-well 18 is embedded in an N-well 20 in the so-called triple well process. The P-well 18 has a typical well depth of, for example, 2 to 4 um with an average doping concentration, for example, in the range of $5\times10^{15}$ to $5\times10^{16}$ atoms per cubic centimeter.

The N-well has a typical well depth of, for example, 4–8 um. The doping concentration may be from $4\times10^{15}$ to $1\times10^{16}$ atoms per cubic centimeter. The triple well i formed by the P-well 18 counterdoping the N-well 20.

The formation of the elements in the triple well is as follows. An N-well implant is performed, for example, with phosphorous ($P_{31}$) with a typical dose of 1.0 to $1.5\times10^{13}$ atoms per square centimeter and energies from 160 Kev to about 100 Kev. The N-well implant is driven using a high temperature step which may typically be 6 to 12 hours at 1125° to 1150° C. The N-well 20 is then counterdoped with a P-well implant. Typical dosages for the P-well implant could be 1.5 to $2.5\times10^{13}$ atoms per square centimeter with energies of 30 Kev to 180 Kev using a species such as boron (B11).

The N-well 20 and P-well 18 are then driven, typically 6 to 10 hours at 1125° to 1150° C. This sets the wells to the desired doping concentrations and depths.

After well formation, standard logic field oxide formation and channel stop formation steps are applied. The field oxide 36 and implant doses are adjusted to achieve a field threshold of 7 to 14 volts, which is determined by the $V_H$ level of the booster pump 74.

After removal of sacrificial oxide, the thicker gate oxides 42, 50 and the thin gate oxides 60, 66 are formed. For example, a 100 Angstrom oxide may be grown across the wafer followed by threshold adjustment implants. Afterward, resist is applied. The resist may cover everything except the thin oxide areas 60 and 62. A buffered oxide etch (BOE) is used to etch off the oxide in the region that is not covered by resist. After resist removal, an oxide is grown to a thickness, for example 100 Angstroms, to form the thin oxides 60 and 66. The rest of the wafer uses gate oxides 42 and 50 with a typical thickness of 160 Angstroms. Standard gate deposition, patterning and back end processing follows the standard logic process. This forms transistors with two gate oxide thicknesses.

While the present invention has been described with respect to a single preferred embodiment, those skilled in the art will appreciate a number of modifications and variations, and it is intended that the appended claims cover all such modifications and variations which fall within the true spirit and scope of the present invention.

What is claimed is:

1. A programmable interconnect comprising:
   a memory cell capable of having a programmed state;
   a first transistor having a gate electrode; and
   a control circuit arranged to communicate either a positive or negative potential to said gate electrode of said first transistor depending on the programmed state of said memory cell.

2. The interconnect of claim 1 wherein said memory cell is a nonvolatile memory cell.

3. The interconnect of claim 1 wherein said control circuit includes an inverter.

4. The interconnect of claim 3, said inverter being formed from an N-channel and a P-channel transistor, said N-channel transistor being formed in a triple well, the source of said N-channel transistor being connected to a negative potential.

5. The interconnect of claim 1 wherein said first transistor is an N-channel transistor, said interconnect including a second transistor connected in parallel with said first transistor, said first and second transistors together forming a transfer gate, said second transistor being a P-channel transistor.

6. The interconnect of claim 1 wherein said first transistor has a gate oxide thickness of greater than 120 Angstroms.

7. The interconnect of claim 1 wherein said first transistor is formed in an embedded P-well.

8. The interconnect of claim 7 wherein said P-well has a concentration of about $1 \times 10^{16}$ atoms per cubic centimeter or less.

9. The interconnect of claim 1 wherein said control circuit selectively supplies either a negative or a positive potential to the gate of said first transistor, said interconnect having a supply voltage, said positive potential being a voltage level higher than said supply voltage.

10. The interconnect of claim 9 wherein there is no conductive path in said control circuit between said positive and negative potentials.

11. A programmable interconnect comprising an approximately zero threshold transistor having a gate electrode, and a memory cell, the memory cell capable of having a programmed state, said memory cell adapted to communicate with said transistor such that the programmed state of said cell determines whether said transistor conducts, said gate electrode being selectively connectable to a negative potential.

12. The interconnect of claim 1 including a supply voltage, wherein said interconnect is selectively connectable to a positive voltage boosted above said supply voltage.

13. The interconnect of claim 12 wherein said transistor is formed in an embedded p-well.

14. The interconnect of claim 11 further including a p-channel transistor connected in parallel to said approximately zero threshold transistor.

15. The interconnect of claim 11 including an inverter adapted to supply a negative potential to the gate electrode of said transistor when the programmed state of said memory is nonconducting.

16. The interconnect of claim 11 including a control circuit adapted to convert the programmed state of said memory cell into a gate electrode bias potential for said transistor, said control circuit including an inverter gate.

17. The interconnect of claim 16 wherein said inverter is adapted to selectively supply either a positive or a negative signal to said gate electrode.

18. The interconnect of claim 16 wherein said inverter includes an n-channel and a p-channel transistor, said p-channel transistor being located in a triple well.

19. The interconnect of claim 11 wherein said approximately zero threshold transistor has a threshold voltage of about 0.1 to −0.3 volts.

20. A method of controlling a transfer gate comprising the steps of:
    applying a signal to the control gate electrode of a memory cell;
    sensing the conducting state of said cell; and
    based on the conducting state of said cell applying either a positive or negative potential to said transfer gate.

21. The method of claim 20 including the step of applying a negative potential to the source of the memory cell.

22. The method of claim 20 including the steps of generating a signal indicative of the conducting state of said cell, inverting said signal and applying the inverted signal to said transfer gate.

23. The method of claim 22 including the step of supplying a pair of supply voltages, boosting said supply voltages to form boosted positive and negative potentials and selectively applying one of said boosted supply voltages to said transfer gate.

24. The method of claim 22 including the steps of using a CMOS inverter including an n-channel and a p-channel transistor, to invert said signal, and biasing the source of said n-channel transistor negatively.

25. The method of claim 20 including the step of biasing the transfer gate such that when said bias is negative the junction under the gate is close to inversion.

26. The method of claim 20 including the step of biasing the transfer gate such that said positive bias is as high as possible without creating gate oxide reliability problems.

27. The method of claim 20 including the step of preventing power consumption by said cell.

28. The method of claim 20 including the step of causing said transfer gate to conduct with approximately zero volts on its gate.

* * * * *